United States Patent [19]

Desai et al.

[11] 4,237,208

[45] Dec. 2, 1980

[54] SILANE ELECTRON BEAM RESISTS

[75] Inventors: Nitin V. Desai, Somerset; Eugene S. Poliniak, Willingboro, both of N.J.

[73] Assignee: RCA Corporation, New York, N.Y.

[21] Appl. No.: 12,961

[22] Filed: Feb. 15, 1979

[51] Int. Cl.² .................... G03C 5/00; C08F 2/46; C08F 30/08; C08G 77/00

[52] U.S. Cl. ................... 430/270; 430/296; 427/43.1; 427/44; 204/159.13

[58] Field of Search .............. 427/43, 44; 96/115 R, 96/35.1, 67 R, 36; 204/159.13; 430/270, 296

[56] References Cited

U.S. PATENT DOCUMENTS

| | | | |
|---|---|---|---|
| 3,113,896 | 12/1963 | Mann | 427/43 |
| 3,758,306 | 9/1973 | Roos | 96/115 R |
| 3,877,980 | 4/1975 | Martin et al. | 427/43 |
| 3,919,438 | 11/1975 | Urkevich | 427/44 |
| 4,018,937 | 4/1977 | Levine et al. | 96/115 R |
| 4,030,416 | 6/1977 | Schank | 96/115 R |
| 4,041,190 | 8/1977 | Dubois et al. | 427/43 |
| 4,070,526 | 1/1978 | Colquhoun | 427/44 |
| 4,107,390 | 8/1978 | Gordon | 427/44 |

OTHER PUBLICATIONS

Dubois Gazard, Electron and Ion Beam Science and Technology, 5th International Conference, 1972, pp. 112-122.

Chem. Absts., vol. 83, 1975, 35631x.

*Primary Examiner*—Mary F. Downey
*Attorney, Agent, or Firm*—Birgit E. Morris; Edward J. Sites

[57] ABSTRACT

Recording media comprising a film of a polymer having a repeating unit of the formula

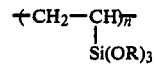

wherein R is an alkyl or acyl group and n is an integer are suitable for recording information with electron beams.

7 Claims, No Drawings

SILANE ELECTRON BEAM RESISTS

This invention relates to novel resists. More particularly, this invention relates to negative working electron beam resists.

BACKGROUND OF THE INVENTION

Photolithography has long been employed in the semiconductor industry to delineate circuit patterns. A layer of a photoresist is applied to the substrate to be patterned and the layer exposed to light of a suitable wavelength through a mask defining the pattern. The photoresist changes its solubility when exposed to the light; positive resists become more soluble by the action of the light, usually by a degradation reaction, and negative resists become more insoluble, usually as a result of crosslinking reactions. The substrate is then contacted with a developer solvent which removes the more soluble portions of the resist. The substrate can then be etched so as to remove portions of the substrate not covered by the photoresist. After etching, the remaining resist is stripped with a solvent.

With the ever increasing miniaturization of circuit patterns, electron beam exposure has begun to be employed instead of light exposure. Electron beams, by virtue of their shorter effective wavelengths and greater depth of focus, can record information at higher densities and resolution than can light beams. However, while some photoresists are also useful as electron beam resists, most are not and a search has been continued to find materials suitable as electron beam resists. Most known electron beam resists are positive acting resists. However, since the electronics industry is more familiar with the use of negative resists, and since negative resists generally are more sensitive, more etch resistant and require less control during processing, negative electron beam resists that have good sensitivity to electron beam radiation and that show good contrast between soluble and insoluble portions after exposure and development, would be preferred.

SUMMARY OF THE INVENTION

We have found that certain polymeric vinyl trialkoxy or triacyloxy silanes are good negative-working electron beam resists. These resists have excellent sensitivity and good contrast and can produce closely packed patterns having straight walls.

DETAILED DESCRIPTION OF THE INVENTION

The polymeric silanes useful herein have a repeating unit

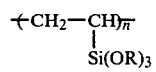

wherein R can be an alkyl or acyl group and n is an integer. The length of the alkyl chain is not critical to performance of these resists.

These polymers can be prepared by distilling the corresponding monomers and oligomers to separate out the higher molecular weight fractions. Distillation under reduced pressure at temperatures of about 60°–80° C. leaves as the residue polymers having a molecular weight from about 1000–2000.

In preparing the recording media of the invention, the purified polymer is solution cast or spun onto a desired support. The nature of the support is conventional and can include polyethylene terephthalate, glass plates, silicon substrates and the like. The concentration of the polymer in the solvent, which can be for example, chloroform, is adjusted so as to deposit a film of the desired thickness onto the support. A 6–8 percent by weight solution can form a film having a thickness of about 5000 angstroms.

An electrically conductive layer is also desirable to remove the charge after electron beam exposure. If the support is non-conducting, a thin conductive film can be applied either to the support prior to coating with the resist, or applied to the surface of the resist layer. The conductive film can be a tin oxide or indium oxide coated glass, glass with a conductive metal film such as chromium or nickel and the like. Alternatively, an electron permeable conductive layer can be formed on the polymer film by vapor deposition of a thin film of copper, nickel, aluminum, chromium or other conductive metal or alloy in known manner.

The recording medium is then ready for exposure to electron beams. A variable speed scanning electron microscope can be employed in known manner to record the desired information pattern in the polymer film, or the film can be flood exposed through a mask.

After recording, the recording medium is developed by immersing in or spraying with a suitable solvent or solvent mixture. Suitable developer solvents for the present resist include chloroform, acetone and the like. Development is continued until the desired amount of soluble resist has been removed or preferably, until the substrate is exposed in the developable areas. The optimum developer solvent and development time for each resist and developer solvent pair can be readily determined by a series of test runs by one skilled in the art.

The invention will be further illustrated by the following Examples, but it is to be understood that the invention is not meant to be limited to the details described therein.

EXAMPLE 1

A 6 percent by weight resist solution of poly(vinyltriethoxy)silane having a molecular weight of 1000–2000 in chloroform was prepared and spin coated at 2000 rpm onto glass slides coated with a layer of chromium and a layer of nickel. A resist layer about 5000 angstroms thick was obtained.

The samples were exposed in an electron beam flood exposure apparatus using a 10 KeV accelerating potential and a dosage of 10 microcoulombs/cm² through a glass mask having a pattern of 3 micron wide bars separated by 3 micron wide spaces.

The samples were developed using chloroform as the developer solvent for about 2 minutes, when the unexposed resist was removed. Excellent pattern delineation was achieved.

EXAMPLE 2

The procedure of Example 1 was followed except substituting poly(vinyl triacetoxy)silane. The slides were baked at 100° C. for one hour. Acetone was employed as the developer solvent.

Excellent pattern delineation was achieved.

We claim:

1. A medium for electron beam recording which comprises a film of a polymer having a repeating unit of the formula

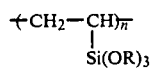

wherein R is an alkyl or acyl group and n is an integer, an electrically conductive layer and a support.

2. A medium according to claim 1 wherein the polymer is poly(vinyl triethoxy)silane.

3. A medium according to claim 1 wherein the polymer is poly(vinyl triacetoxy)silane.

4. A medium according to claim 1 wherein the polymer has a molecular weight of about 1000–2000.

5. A medium according to claim 1 wherein said electrically conductive layer is adjacent to the support.

6. In the method of recording information whereby a resist material which becomes more insoluble in a developer solvent when impinged upon by a beam of electrons is selectively exposed to an electron beam and the resist material is developed with a developer solvent so as to remove the more soluble portions thereof, the improvement which comprises employing as the resist material a film of a polymer having a repeating unit of the formula

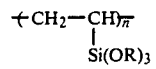

wherein R is alkyl or acyl and n is an integer, an electrically conductive layer and a support.

7. The method according to claim 6 wherein said electrically conductive layer is adjacent to the support.

* * * * *